United States Patent
Liu et al.

(10) Patent No.: US 8,188,536 B2
(45) Date of Patent: May 29, 2012

(54) MEMORY DEVICE AND MANUFACTURING METHOD AND OPERATING METHOD THEREOF

(75) Inventors: Cheng-Jye Liu, Hsinchu (TW); Tai-Liang Hsiung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 390 days.

(21) Appl. No.: 11/475,269

(22) Filed: Jun. 26, 2006

(65) Prior Publication Data

US 2007/0296024 A1   Dec. 27, 2007

(51) Int. Cl.
*H01L 29/792* (2006.01)

(52) U.S. Cl. .............. 257/324; 257/326; 257/E29.309

(58) Field of Classification Search ........... 257/E21.679, 257/E27.103, 314–326, E29.309; 438/163; 365/185.01–185.33
See application file for complete search history.

(56) References Cited

U.S. PATENT DOCUMENTS

| | | | |
|---|---|---|---|
| 5,284,785 A | 2/1994 | Gill | 438/364 |
| 6,607,957 B1 * | 8/2003 | Fan et al. | 438/276 |
| 6,803,620 B2 * | 10/2004 | Moriya et al. | 257/298 |
| 6,878,988 B1 * | 4/2005 | Lee et al. | 257/324 |
| 6,888,755 B2 | 5/2005 | Harari | 365/85.18 |
| 6,969,663 B2 * | 11/2005 | Takahashi | 438/400 |
| 7,208,382 B1 * | 4/2007 | Erhardt et al. | 438/301 |
| 7,486,560 B2 * | 2/2009 | Wu | 365/185.18 |
| 2003/0006450 A1 * | 1/2003 | Haspeslagh | 257/316 |
| 2005/0020013 A1 * | 1/2005 | Moriya et al. | 438/262 |
| 2006/0027855 A1 * | 2/2006 | Hur et al. | 257/315 |
| 2006/0131635 A1 * | 6/2006 | Lai et al. | 257/315 |
| 2006/0278936 A1 * | 12/2006 | Fujii et al. | 257/382 |
| 2007/0029610 A1 * | 2/2007 | Wei et al. | 257/345 |

FOREIGN PATENT DOCUMENTS

| | | |
|---|---|---|
| CN | 1441482 | 9/2003 |
| TW | 427018 | 3/2001 |
| TW | 530303 | 5/2003 |
| TW | I250644 | 3/2006 |
| TW | I270199 | 1/2007 |

* cited by examiner

*Primary Examiner* — Kiesha Bryant
*Assistant Examiner* — Eric Ward
(74) *Attorney, Agent, or Firm* — J.C. Patents

(57) ABSTRACT

A memory device including a substrate, a plurality of conductive layers, a composite dielectric layer and a plurality of gates are provided. Wherein, the conductive layers are disposed on the substrate. The composite dielectric layer is disposed on the substrate and covers the conductive layers. The composite dielectric layer includes a charge trapping layer. The gates are disposed on the composite dielectric layer and across the conductive layers. Wherein, the conductive layers can be used as local bit lines to reduce the resistance values and improve the performance of the memory device.

5 Claims, 8 Drawing Sheets

MEMORY DEVICE AND MANUFACTURING METHOD AND OPERATING METHOD THEREOF

BACKGROUND OF THE INVENTION

1. Field of Invention

The present invention relates to a semiconductor device and the method for manufacturing and operating the same, and more particularly to a memory device and the method for manufacturing and operating the same.

2. Description of Related Art

Non-volatile memory is a kind of memory device that the data stored therein will not be lost when the power supply is cut off, which includes such non-volatile memories that data programming, reading, and erasing operations can be performed thereto repeatedly, for example, "Electrically Erasable Programmable Read-Only Memory" (EEPROM) and "silicon Nitride Read-Only Memory", and such non-volatile memories have been applied widely into various personal computers and electronic devices.

FIG. 1A is a top view of a conventional Nitride Read-Only Memory. FIG. 1B is a cross-sectional view of the cut along line I-I' of FIG. 1A. Referring to FIGS. 1A and 1B, to manufacture this Nitride Read-Only Memory, a plurality of gate structures 125 are formed on the substrate 100 first, wherein a gate structure 125 includes, from bottom to top, an ONO (oxide/nitride/oxide) stack layer 110 and a gate 120. Then, buried bit lines 130 are formed, and a silicon oxide layer 140 is formed at two sides of the gate structures 125. After that, the word lines 150 are formed on the gate structures 125 to connect the gate structures 125 in series.

In the foregoing manufacturing process of Nitride Read-Only Memory, while the silicon oxide layer 140 is formed, the silicon oxide on the gates 120 is removed through chemical mechanical polishing (CMP). Or, silicon nitride is formed on the gates 120 first, and then the silicon oxide on the gates 120 is removed through lift-off. These methods will either cause defects in the memory device, or have complex procedure, so that they are very disadvantageous in the manufacturing process.

Besides, since the gates 120 become block structures from the original stripe structures while the word lines 150 are formed, thus bridging and short circuit will be caused between the word lines 150 if the etching of the gates 120 is incomplete.

Moreover, integrated circuit technology is developing quickly; accordingly the expectation to the device integrity is getting higher and higher. Thus, the affection of short channel effect will get more obvious along with the reduction of line widths. To prevent short channel effect, the depth of the buried bit lines 130 has to be decreased as much as possible. However, this will cause the resistance values of the buried bit lines 130 being too high, which is very disadvantageous to the performance of the memory device.

An EEPROM is disclosed in the U.S. Pat. No. 5,284,785, wherein no doped region is formed in the substrate, so that the short channel effect can be reduced, and the operating area thereof is wide. Moreover, it's not necessary to dispose a field oxide.

However, a floating gate and a controlling gate have to be formed in this EEPROM, so it is difficult to integrate this EEPROM with a general CMOS process, and a silicon oxide layer has to be disposed additionally to separate the floating gate and the bit lines. Besides, an n-type lightly doped region has to be formed additionally in the memory device to improve the operating efficiency of FN tunneling.

SUMMARY OF THE INVENTION

Accordingly, the present invention is directed to provide a memory device, which can reduce short channel effect and is advantageous in memory device minimization.

According to another aspect of the present invention, a manufacturing method of a memory device is provided, wherein simple process is used for forming local bit lines, so that the other complex processes can be skipped and defects in the memory can be avoided.

According to other aspect of the present invention, an operating method of a memory device is provided, which can increase the operation speed of the memory device.

The present invention provides a memory device including a substrate, a plurality of conductive layers, a composite dielectric layer and a plurality of gates. Wherein, the conductive layers are disposed on the substrate; the composite dielectric layer is disposed on the substrate and covers the conductive layers, and the composite dielectric layer includes a charge trapping layer; the gates are disposed on the composite dielectric layer and across the conductive layers.

In the foregoing memory device, the conductive layers are used as, for example, local bit lines.

In the foregoing memory device, the material of the conductive layers is, for example, doped polysilicon. A dopant diffusion region is disposed in the substrate under each conductive layer.

In the foregoing memory device, an insulating layer disposed between the conductive layers and the substrate is further included. And the thickness of the insulating layer is, for example, between 20-200 A. An inversion region is formed in the substrate under the conductive layers corresponding to the voltage supplied to the conductive layers.

In the foregoing memory device, further including a plurality of doped regions disposed correspondingly in the substrate under the conductive layers, and the doped regions under two adjacent conductive layers are respectively disposed at one side of one of the two conductive layers and at another side of the other conductive layer.

In the foregoing memory device, the material of the charge trapping layer is, for example, silicon nitride.

In the foregoing memory device, the composite dielectric layer includes, from bottom to top, a bottom dielectric layer, a charge trapping layer, and a top dielectric layer.

In the foregoing memory device, the dopant diffusion region under the conductive layers, or the inversion region is used as the source/drain, so that a memory device having shallow junction or non-doped substrate can be formed, which can not only reduce the short channel effect, but also help to minimize the memory device. Besides, with conductive layers as local bit lines, the resistance values of the bit lines can be reduced, and further, the operation speed of the memory device can be increased.

The present invention provides a manufacturing method of a memory device. Wherein, for example, a substrate is provided first, and a plurality of conductive layers are formed on the substrate; then, a composite dielectric layer including a charge trapping layer is formed on the substrate and covers the conductive layers; after that, a plurality of gates are formed on the substrate across the conductive layers.

In the foregoing manufacturing method of a memory device, further comprising a step of forming a plurality of dopant diffusion regions in the substrate under the conductive layers after the conductive layers are formed. Wherein, the conductive layers are used as, for example, local bit lines.

In the foregoing manufacturing method of a memory device, further comprising a step of forming an insulating layer on the substrate before the conductive layers are formed. The thickness of the insulating layer is, for example, between 20-200 A.

In the foregoing manufacturing method of a memory device, further comprising a step of forming a plurality of doped regions in the substrate under the conductive layers before the insulating layer is formed. Wherein, the doped regions under two adjacent conductive layers are respectively disposed at one side of one of the two conductive layers and at another side of the other conductive layer.

In the foregoing manufacturing method of a memory device, further comprising a step of forming a plurality of doped regions in the substrate under the conductive layers after the gates are formed. Wherein the doped regions under two adjacent conductive layers are respectively disposed at one side of one of the two conductive layers and at another side of the other conductive layer.

In the foregoing manufacturing method of a memory device, the composite dielectric layer includes, from bottom to top, a bottom dielectric layer, the charge trapping layer and a top dielectric layer.

In the foregoing manufacturing method of a memory device, the formation method of the bottom dielectric layer is thermal oxidation.

In the foregoing manufacturing method of a memory device, the formation method of the gates includes, for example: first, forming a conductive material layer on the substrate; then, forming a patterned photoresist layer on the conductive material layer; removing a part of the conductive material layer with the patterned photoresist layer as the mask; and finally removing the patterned photoresist layer.

In the foregoing manufacturing method of a memory device, the step of removing a part of the conductive material layer further includes using the composite dielectric layer as the stop layer.

In the foregoing manufacturing method of a memory device, the material of the conductive layer includes doped polysilicon.

According to the forgoing manufacturing method of a memory device, simple process is used to form local bit lines (conductive layers), thus, not only the other complex processes are skipped, but also defects in the memory device are avoided. Besides, since it is not necessary to etch the conductive layers at the bottom together in the process of forming the gates, instead, the composite dielectric layer is used as the etching stop layer, thus, incomplete etching, bridging and short circuit between conductive layers are avoided.

The present invention provides an operating method of a memory device. The memory device is disposed on a substrate. The memory device includes: a plurality of pairs of conductive layers disposed on the substrate, each pair of conductive layers including a first conductive layer and a second conductive layer; a composite dielectric layer disposed on the substrate and covering the conductive layers, the composite dielectric layer including a charge trapping layer; a plurality of gates disposed on the composite dielectric layer and across the conductive layers.

The operating method is, for example: a $1^{st}$ voltage is supplied to the first conductive layer of the selected conductive layers, a $2^{nd}$ voltage is supplied to the second conductive layer of the selected conductive layers, a $3^{rd}$ voltage is supplied to a selected gate, a $4^{th}$ voltage is supplied to the substrate, and the electrons are injected into the charge trapping layer.

In the foregoing operating method of a memory device, the memory is an n-type memory device.

In the foregoing operating method of a memory device, the $3^{rd}$ voltage is larger than the $1^{st}$ voltage, the $1^{st}$ voltage is larger than the $2^{nd}$ voltage, the $2^{nd}$ voltage is larger than the $4^{th}$ voltage, and the electrons are injected into the charge trapping layer by the channel hot electron injection (CHEI) mechanism.

The foregoing operating method of the memory device further includes while performing an erasing operation, supplying the $1^{st}$ voltage to the first conductive layer, supplying the $2^{nd}$ voltage to the second conductive layer, supplying a $5^{th}$ voltage to the selected gate, supplying the $4^{th}$ voltage to the substrate, and erasing electrons in the charge trapping layer by the band-to-band tunneling induced hot hole injection mechanism, wherein the $1^{st}$ voltage is larger than the $2^{nd}$ voltage, the $2^{nd}$ voltage is larger than the $4^{th}$ voltage, and the $4^{th}$ voltage is larger than the $5^{th}$ voltage.

The foregoing operating method of a memory device further includes while performing a reading operation, supplying a $6^{th}$ voltage to the first conductive layer, supplying a $7^{th}$ voltage to the second conductive layer, supplying an $8^{th}$ voltage to the selected gate, and supplying the $4^{th}$ voltage to the substrate, wherein the $8^{th}$ voltage is larger than the $6^{th}$ voltage, the $6^{th}$ voltage is larger than the $7^{th}$ voltage, the $7^{th}$ voltage is larger than the $4^{th}$ voltage.

In the foregoing operating method of a memory device, the memory device is a p-type memory device.

In the foregoing operating method of a memory device, the $3^{rd}$ voltage is larger than the $4^{th}$ voltage, the $4^{th}$ voltage is larger than the $2^{nd}$ voltage, the $2^{nd}$ voltage is larger than the $1^{st}$ voltage, and the electrons are injected into the charge trapping layer by the band-to-band tunneling hot holes induced hot electron injection (BTBTHE) mechanism.

The foregoing operating method of the memory device further includes while performing an erasing operation, supplying a $5^{th}$ voltage to the first conductive layer, supplying a $6^{th}$ voltage to the second conductive layer, supplying a $7^{th}$ voltage to the selected gate, supplying an $8^{th}$ voltage to the substrate, and erasing electrons in the charge trapping layer by the channel FN tunneling mechanism, wherein the $8^{th}$ voltage is larger than the $7^{th}$ voltage.

The foregoing operating method of a memory device further includes while performing a reading operation, supplying a $9^{th}$ voltage to the first conductive layer, supplying a $10^{th}$ voltage to the second conductive layer, supplying an $11^{th}$ voltage to the selected gate, and supplying the $4^{th}$ voltage to the substrate, wherein the $4^{th}$ voltage is larger than the $10^{th}$ voltage, the $10^{th}$ voltage is larger than the $9^{th}$ voltage, the $9^{th}$ voltage is larger than the $11^{th}$ voltage.

The present invention provides another operating method of a memory device. The memory device is disposed on a substrate. The memory device includes: a plurality of pairs of conductive layers disposed on the substrate, each pair of conductive layers including a first conductive layer and a second conductive layer; an insulating layer, disposed between each conductive layer and the substrate; a composite dielectric layer disposed on the substrate and covering the conductive layers, the composite dielectric layer including a charge trapping layer; a plurality of pairs of doped regions disposed in the substrate, each pair of doped regions comprising a first doped region and a second doped region, being respectively disposed in the substrate under one side of the first conductive layer and in the substrate under another side of the second conductive layer; a plurality of gates disposed on the composite dielectric layer and across the conductive layers.

The operating method is, for example: a $1^{st}$ voltage is supplied to the first conductive layer of the selected conductive layers, a $2^{nd}$ voltage is supplied to the second conductive layer of the selected conductive layers, a $3^{rd}$ voltage is supplied to the first doped region under the first conductive layer, a $4^{th}$ is supplied to the second doped region under the second conductive layer, a $5^{th}$ voltage is supplied to a selected gate, a $6^{th}$ voltage is supplied to the substrate, and the electrons are injected into the charge trapping layer, wherein the $1^{st}$ voltage and the $2^{nd}$ voltage lead to two inversion regions being formed in the substrate under the first and the second conductive layers respectively.

In the foregoing operating method of a memory device, the memory device is an n-type memory device.

In the foregoing operating method of a memory device, the $5^{th}$ voltage is larger than the $3^{rd}$ voltage, the $3^{rd}$ voltage is larger than the $4^{th}$ voltage, the $4^{th}$ voltage is larger than the $6^{th}$ voltage, and the electrons are injected into the charge trapping layer by the channel hot electron injection (CHEI) mechanism.

The foregoing operating method of a memory device further includes while performing an erasing operation, supplying the $1^{st}$ voltage to the first conductive layer, supplying the $2^{nd}$ voltage to the second conductive layer, supplying the $3^{rd}$ voltage to the first doped region, supplying the $4^{th}$ voltage to the second doped region, supplying a $7^{th}$ to the selected gate, supplying the $6^{th}$ voltage to the substrate, and erasing electrons in the charge trapping layer by the band-to-band tunneling induced hot hole injection mechanism, wherein the $3^{rd}$ voltage is larger than the $4^{th}$ voltage, the $4^{th}$ voltage is larger than the $6^{th}$ voltage, the $6^{th}$ voltage is larger than the $7^{th}$ voltage, and the $1^{st}$ voltage and the $2^{nd}$ voltage lead to the inversion regions being formed in the substrate under the first and the second conductive layers.

The foregoing operating method of a memory device further includes while performing a reading operation, supplying the $1^{st}$ voltage to the first conductive layer, supplying the $2^{nd}$ voltage to the second conductive layer, supplying an $8^{th}$ voltage to the first doped region, supplying a $9^{th}$ voltage to the second doped region, supplying a $10^{th}$ voltage to the selected gate, and supplying the $6^{th}$ voltage to the substrate, wherein the $10^{th}$ voltage is larger than the $8^{th}$ voltage, the $8^{th}$ voltage is larger than the $9^{th}$ voltage, the $9^{th}$ voltage is larger than the $6^{th}$ voltage, and the $1^{st}$ voltage and the $2^{nd}$ voltage lead to the inversion regions being formed in the substrate under the first and the second conductive layers.

In the foregoing operating method of a memory device, the memory device is a p-type memory device.

In the foregoing operating method of a memory device, the $5^{th}$ voltage is larger than the $6^{th}$ voltage, the $6^{th}$ voltage is larger than the $4^{th}$ voltage, the $4^{th}$ voltage is larger than the $3^{rd}$ voltage, and the electrons are injected into the charge trapping layer by the band-to-band tunneling hot holes induced hot electron injection (BTBTHE) mechanism.

The foregoing operating method of a memory device further includes while performing an erasing operation, supplying the $1^{st}$ voltage to the first conductive layer, supplying the $2^{nd}$ voltage to the second conductive layer, supplying a $7^{th}$ voltage to the first doped region, supplying an $8^{th}$ voltage to the second doped region, supplying a $9^{th}$ to the selected gate, supplying a $10^{th}$ voltage to the substrate, and erasing electrons in the charge trapping layer by the channel FN tunneling mechanism, wherein the $10^{th}$ voltage is larger than the $9^{th}$ voltage, and the $1^{st}$ voltage and the $2^{nd}$ voltage lead to the inversion regions being formed in the substrate under the first and the second conductive layers.

The foregoing operating method of a memory device further includes while performing a reading operation, supplying the $1^{st}$ voltage to the first conductive layer, supplying the $2^{nd}$ voltage to the second conductive layer, supplying an $11^{th}$ voltage to the first doped region, supplying a $12^{th}$ voltage to the second doped region, supplying a $13^{th}$ to the selected gate, supplying the $6^{th}$ voltage to the substrate, wherein the $6^{th}$ voltage is larger than the $12^{th}$ voltage, the $12^{th}$ voltage is larger than the $11^{th}$ voltage, the $11^{th}$ voltage is larger than the $13^{th}$ voltage, and the $1^{st}$ voltage and the $2^{nd}$ voltage lead to the inversion regions being formed in the substrate under the first and the second conductive layers.

In the foregoing operating method of a memory device, the memory device further includes an insulating layer, a first doped region, and a second doped region. Wherein the insulating layer is disposed between each conductive layer and the substrate, and an inversion region is formed in the substrate under the conductive layers corresponding to the voltage supplied to the conductive layers. The first doped region and the second doped region are respectively disposed in the substrate under one side of the first conductive layer and in the substrate under another side of the second conductive layer.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
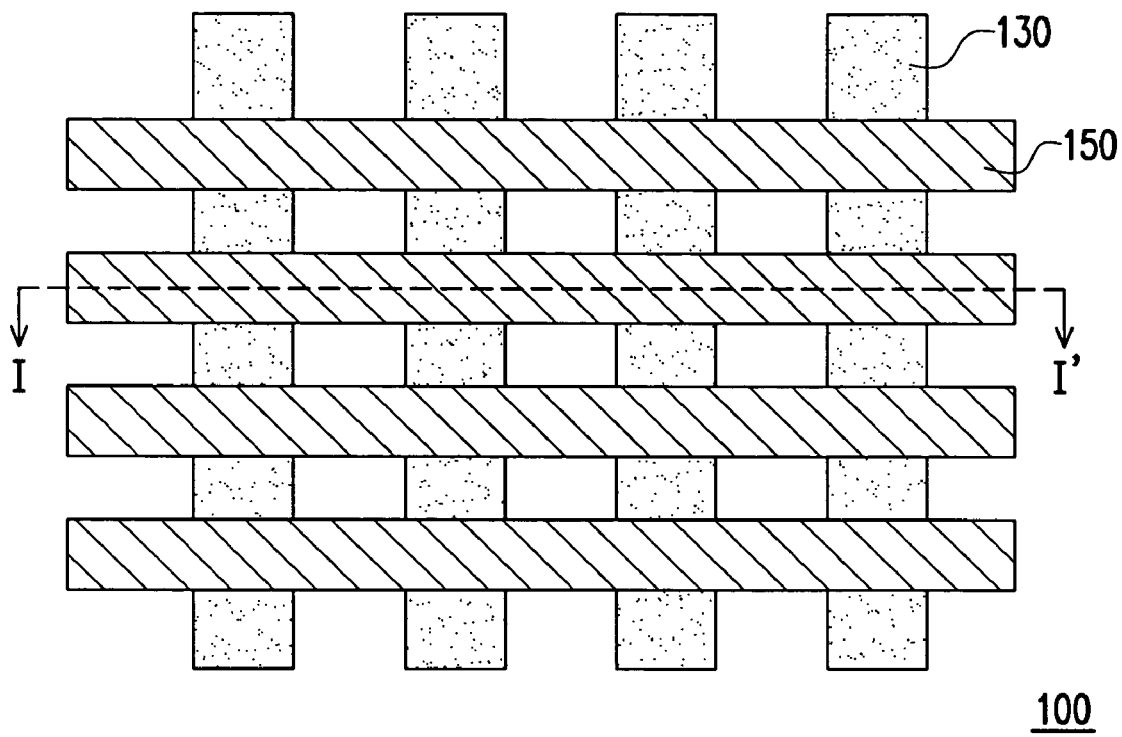
FIG. 1A is a top view of a conventional Nitride Read-Only Memory.
Figure 1B:
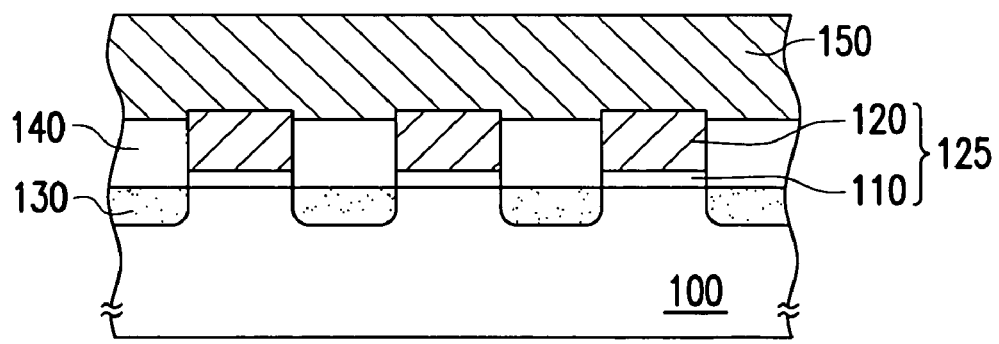
FIG. 1B is a cross-sectional view of the cut along line I-I' of FIG. 1A.
Figure 2A:
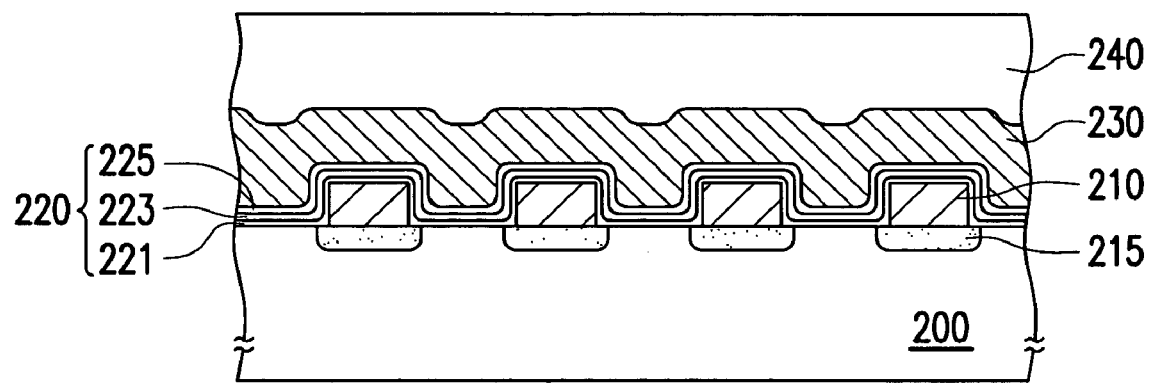
FIG. 2A is a cross-sectional view of a memory device according to an embodiment of the present invention.

FIG. 2A is a cross-sectional view of a memory device according to an embodiment of the present invention. Referring to FIG. 2A, the memory device in the present embodiment includes, for example, a substrate 200, a plurality of conductive layers 210, a composite dielectric layer 220 and a plurality of gates 230. Wherein, the conductive layers 210 are disposed on the substrate. The composite dielectric layer 220 is disposed on the substrate 200 and covers the conductive layers 210. The gates 230 are disposed, for example, on the composite dielectric layer 220 and across the conductive layers 210.

Wherein, the substrate 200 is, for example, p-type silicon substrate. The material of the conductive layers 210 is, for example, doped polysilicon, and the dopant in the doped polysilicon is, for example, n-type dopant such as arsenic and phosphorus. The dopant diffuses, for example, from the conductive layers 210 downwards to the substrate 200 so as to form a dopant diffusion region 215 in the substrate 200. The dopant diffusion region 215 is used as, for example, the source/drain, and the conductive layers 210 are used as, for example, local bit lines. Certainly, since the material of the conductive layers 210 is doped polysilicon, thus, the conductive layers 210 may also be used as the source/drain together with the dopant diffusion region 215.

Of course, the substrate 200 can further includes an N-well (not shown) being disposed therein, and the material of the conductive layers 210 can be doped polysilicon with p-type dopant such as boron, $BF_2$, or indium. In another word, the memory device can also be a p-type memory device.

The composite dielectric layer 220 includes, from bottom to top, a bottom dielectric layer 221, a charge trapping layer 223 and a top dielectric layer 225. Wherein, the material of the bottom dielectric layer 221 is, for example, silicon oxide, the material of the charge trapping layer 223 is, for example, silicon nitride, and the material of the top dielectric layer 225 is, for example, silicon oxide. Certainly, the material of the bottom dielectric layer 221 and the top dielectric layer 225 may also be other similar dielectric materials. The material of the charge trapping layer 223 is not limited to silicon nitride, it may also be other material which can trap the charges, such as high K material, tantalum oxide, $SrTiO_3$, and hafnium oxide etc.

The gates 230 are, for example, disposed on the composite dielectric layer 220 and across the conductive layers 210. The material of the gates 230 is, for example, doped polysilicon. In the present embodiment, the gates 230 are used as, for example, word lines. An interlayer dielectric layer 240 is disposed over the gates 230, and the material of the interlayer dielectric layer 240 is conductive material such as silicon oxide.

In the memory device in the embodiment described above, the dopant diffusion region 215 under the conductive layers 210 is used as the source/drain, so as to form a shallow junction memory device. The characteristic of shallow junction can help to reduce the short channel effect and to minimize the memory device.

In addition, the conductive layers 210 are used as the local bit lines, thus, the resistance values of the bit lines can be reduced, and furthermore, the operation speed of the memory device can be increased. Moreover, with the disposition of the composite dielectric layer 220, the charges can be trapped by the charge trapping layer 223 therein, and thus the conductive layers 210 (bit lines) and the gates 230 (word lines) can be separated.

Figure 2B:
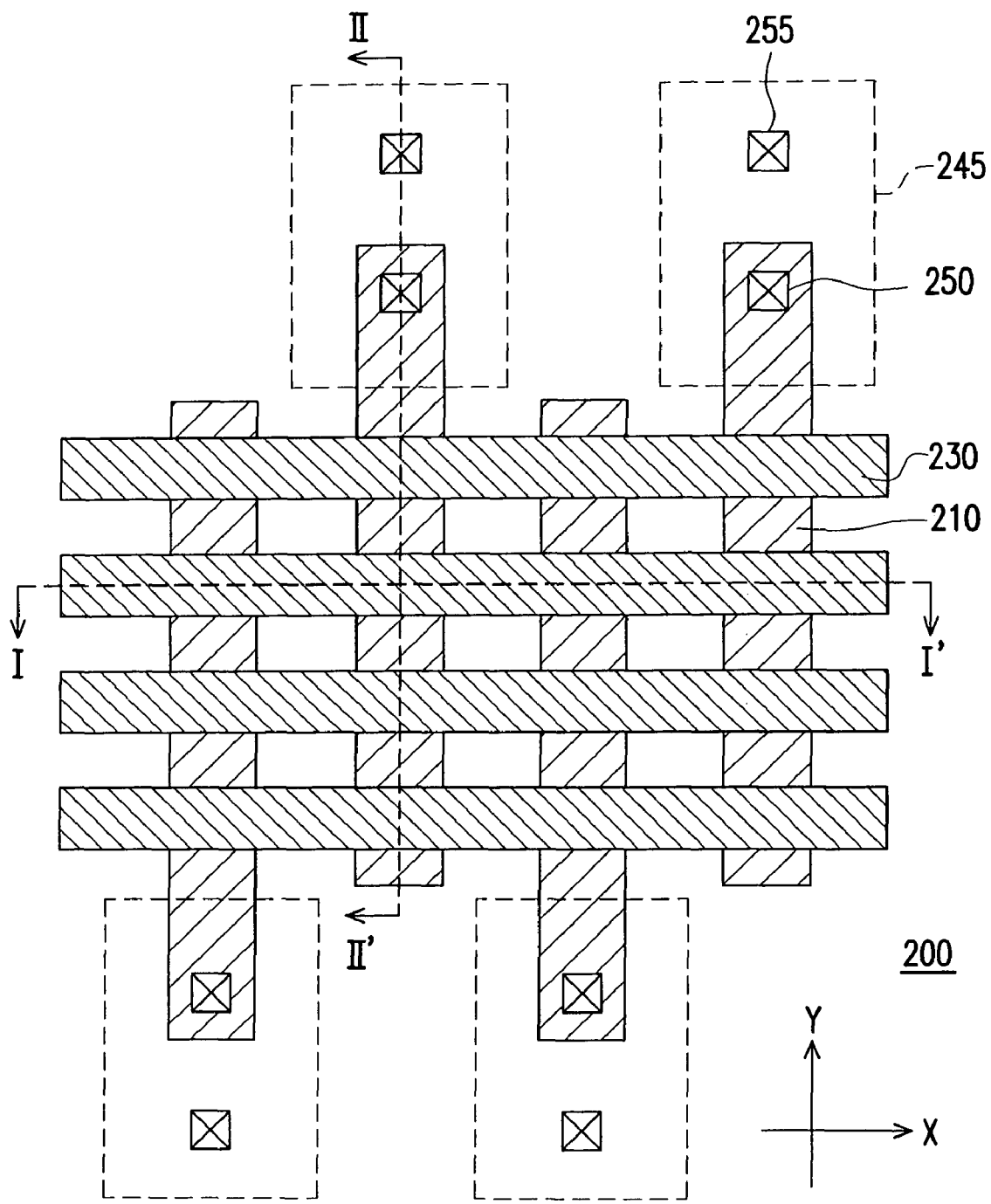
FIG. 2B is a top view of a memory device according to other embodiment of the present invention.
Figure 2C:
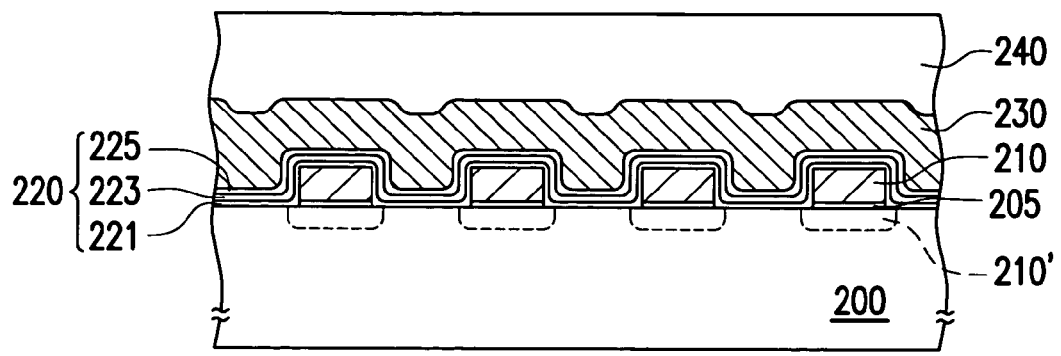
FIG. 2C is a cross-sectional view of the cut along line I-I' of FIG. 2B.
Figure 2D:
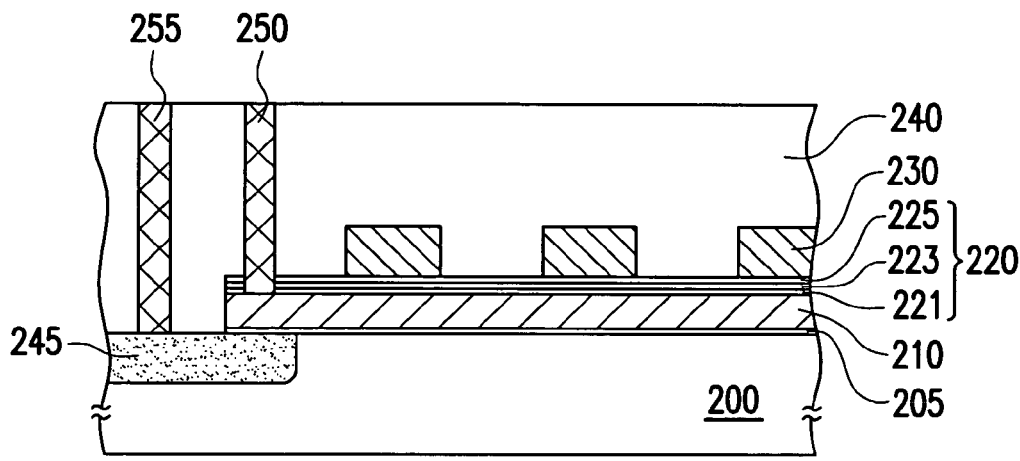
FIG. 2D is a cross-sectional view of the cut along line II-II' of FIG. 2B.

In particular, in other embodiment, an insulating layer 205 can be further disposed between the conductive layers 210 and the substrate 200 (as shown in FIG. 2C). Refer to FIGS. 2B~2D. FIG. 2B is a top view of a memory device according to other embodiment of the present invention. FIG. 2C is a cross-sectional view of the cut along line I-I' of FIG. 2B. FIG. 2D is a cross-sectional view of the cut along line II-II' of FIG. 2B.

The material of the insulating layer 205 is insulating material such as silicon oxide, so that the dopant in the conductive layers 210 will not diffuse into the substrate 200 due to high process temperature. The thickness of the insulating layer 205 is, for example, between 20-200 A. Certainly, the material of the conductive layers 210 can also be non-doped polysilicon, so that there will be no dopant diffusion in the substrate 200.

Referring to FIG. 2D, for example, a contact window 250 connected to the leads (not shown) is disposed on the conductive layers 210. By supplying appropriate voltage to the conductive layers 210, an inversion region 210' is formed in the substrate 200 under the conductive layers 210 corresponding to the voltage supplied to the conductive layers 210. The dynamically disposed inversion region 210' can be used as the source/drain, thus, it is not necessary to dispose a doped region additionally in the substrate 200 to use as the source/drain.

It is remarkable that from the top view in FIG. 2B, the conductive layers 210 are approximately arranged in parallel and disposed on the substrate 200, and the conductive layers can be used as, for example, local bit lines. The gates 230 are approximately arranged in parallel and disposed on the composite dielectric layer 220, which can be, for example, across the conductive layers 210 and extending in direction X, and the gates 230 are used as, for example, word lines.

Referring to FIGS. 2B and 2D, since an insulating layer 205 is disposed between the conductive layer 210 and the substrate 200, thus, a doped region 245 is disposed corresponding to each conductive layer 210 in the substrate 200 under the end of the conductive layer 210, and the doped region 245 is, for example, n-type heavily arsenic-doped or phosphorus-doped region. A contact window 255 connected to the leads (not shown) is disposed on the doped region 245 for controlling the voltage of the inversion region 210' (source/drain).

Referring to FIG. 2B, additionally, the doped regions 245 under two adjacent conductive layers 210 are respectively disposed at one side of one of the two conductive layers 210 and at another side of the other conductive layer 210. In other words, to arrange the conductive layers 210 more closely, the doped regions 245 are, for example, disposed at two sides of the conductive layers 210 in a staggered way.

Figure 2E:
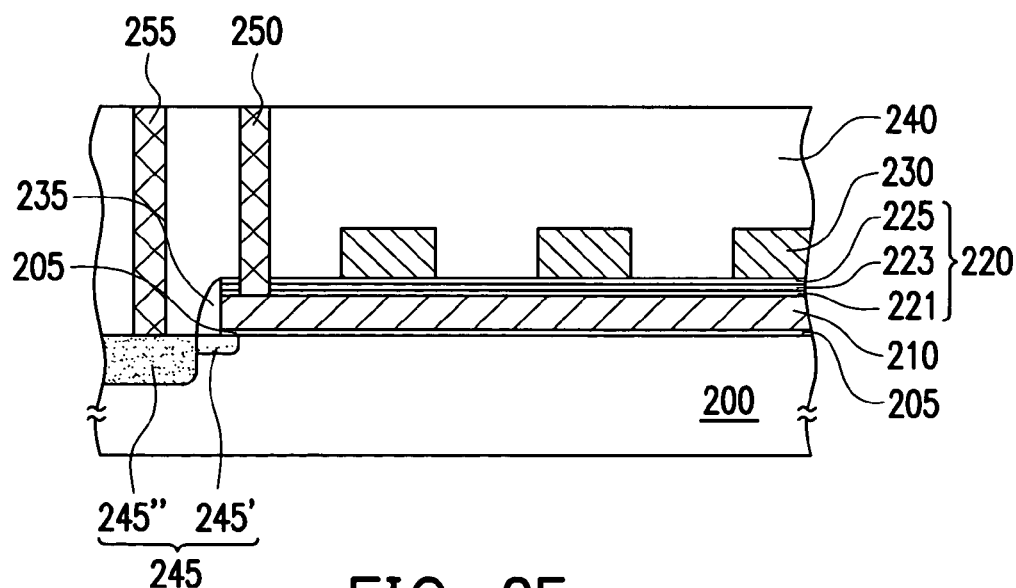
FIG. 2E is a cross-sectional view of a memory device according to yet another embodiment of the present invention.

In an embodiment, the doped regions 245 may also have the structure similar to that of a typical CMOS. Referring to FIG. 2E, a doped region 245 includes, for example, a lightly doped region 245' and a heavily doped region 245" with high dopant concentration. The doped region 245 can be integrated with the typical CMOS process and can control the voltage of the inversion region 210' (source/drain) as well.

According to the memory device in the embodiment described above, the inversion region 210' is used as the source/drain, so that it is not necessary to implant (or drive in) dopants in the substrate 200, thus the short channel effect can be avoided. Moreover, the size of the inversion region 210' can be controlled more accurately according to the minimum size of the process, thus, the size of the memory device can be reduced effectively and further the integrity of the device can be increased.

Figure 3A:
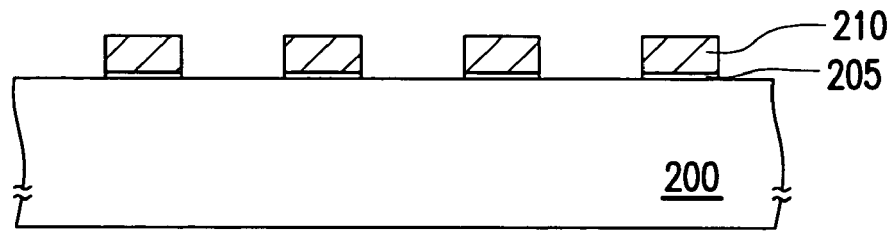
FIGS. 3A~3C are cross-sectional views of the manufacturing process along direction X obtained by cutting along line I-I' in FIG. 2B.
Figure 3B:
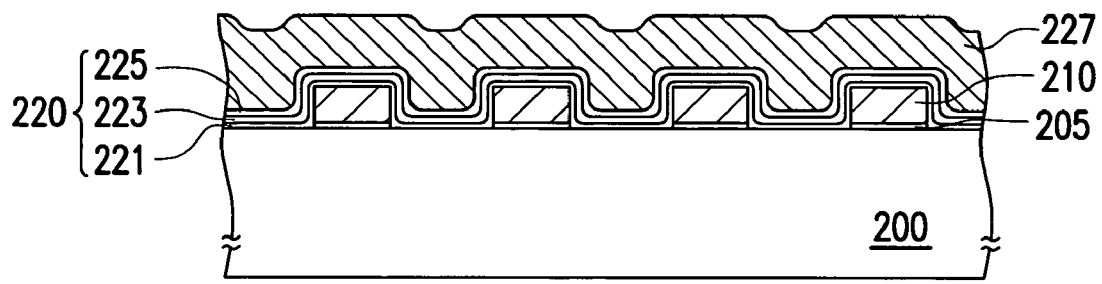
Figure 3C:
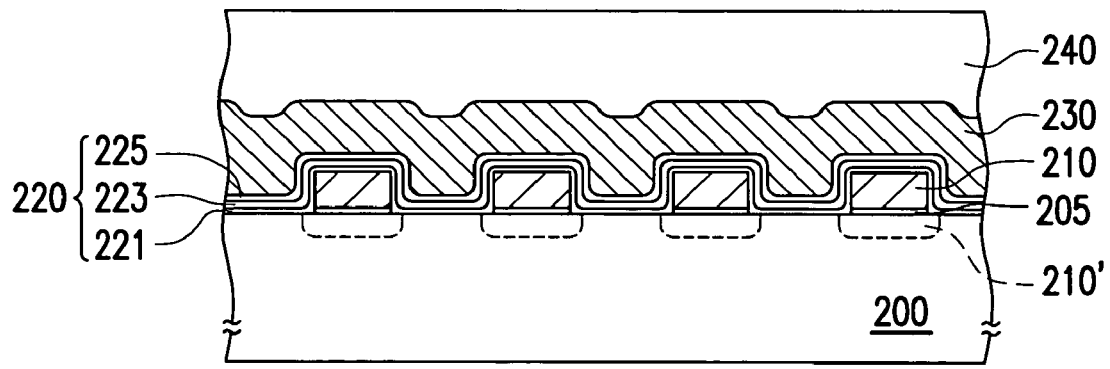

The manufacturing method of a memory device in the present invention will be described below. FIGS. 3A~3C are cross-sectional views of the manufacturing process along direction X obtained by cutting along line I-I' in FIG. 2B.

Figure 4A:
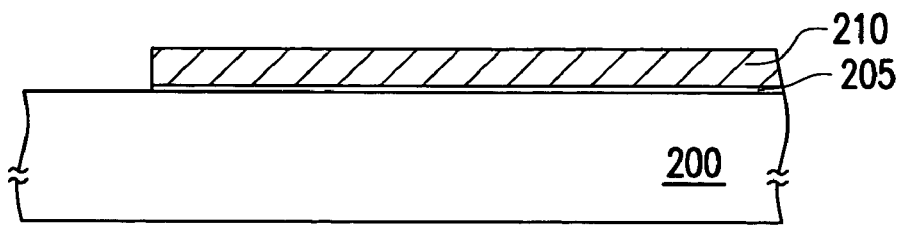
FIGS. 4A~4C are cross-sectional views of the manufacturing process along direction Y obtained by cutting along line II-II' in FIG. 2B.
Figure 4B:
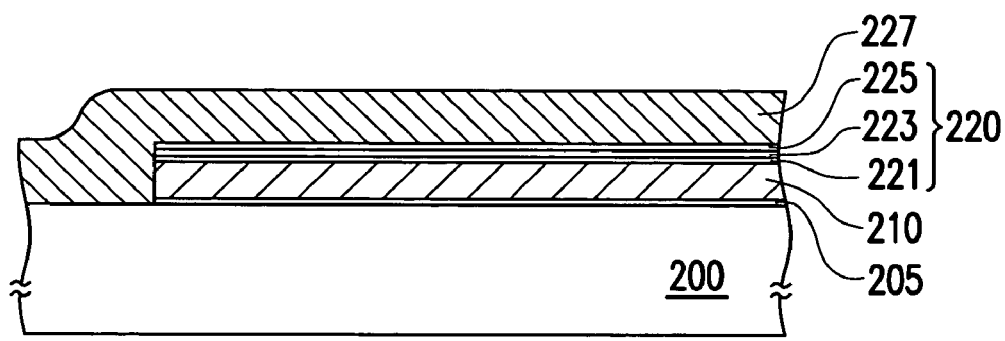
Figure 4C:
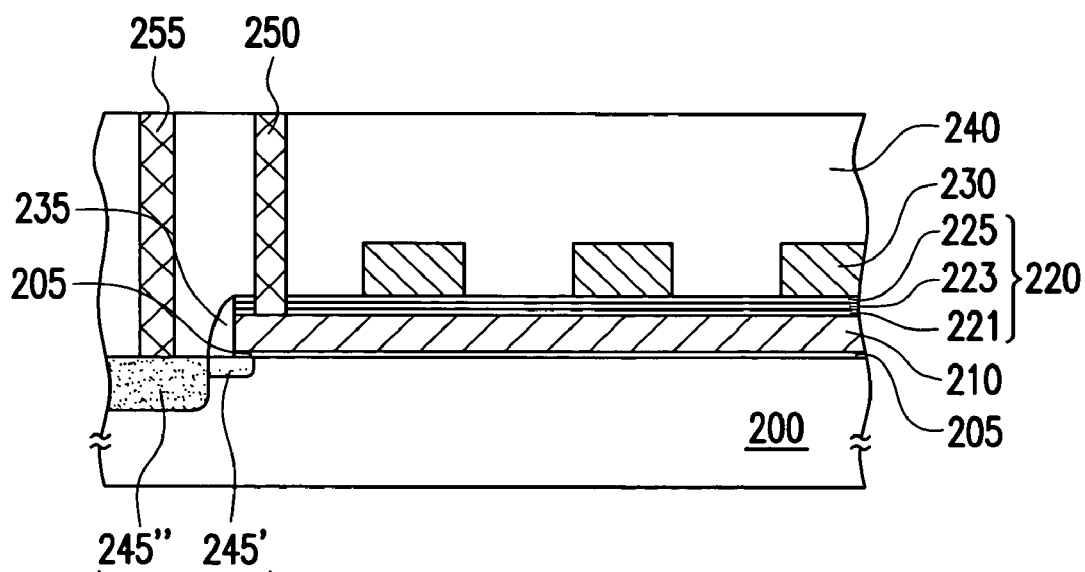

FIGS. 4A~4C are cross-sectional views of the manufacturing process along direction Y obtained by cutting along line II-II' in FIG. 2B.

Referring to FIGS. 3A and 4A, the manufacturing method of a memory device according to an embodiment of the present invention includes the following steps. First, a substrate 200 is provided, which is, for example, a p-type substrate. Then, an insulating material layer (not shown) is formed on the substrate 200, the material of the insulating material layer is, for example, silicon oxide, and the formation method thereof is, for example, chemical vapor deposition. The thickness of the insulating material layer is, for example, between 20-200 A. Next, a conductive material layer (not shown) is formed on the insulating material layer, the material of the conductive material layer is, for example, doped polysilicon, and the formation method thereof is, for example, performing ion implant after forming a non-doped polysilicon layer with chemical vapor deposition, or forming the doped polysilicon with chemical vapor deposition in the manner of in-situ dopant implant. Certainly, the material of the conductive material layer may also be conductive material of non-doped polysilicon.

Next, the conductive material layer and the insulating material layer are patterned so as to form the conductive layers 210 and the insulating layer 205. The method for removing a part of the conductive material layer and a part of the insulating material layer is, for example, performing lithography, etching processes.

After that, referring to FIGS. 3B and 4B, a composite dielectric layer 220 is formed on the substrate 200. The composite dielectric layer 220 is formed by, from bottom to top, a bottom dielectric layer 221, a charge trapping layer 223 and a top dielectric layer 225. The material of the bottom dielectric layer 221 is, for example, silicon oxide, and the formation method thereof is, for example, thermal oxidation. The material of the charge trapping layer 223 is, for example, silicon nitride, and the formation method thereof is, for example, chemical vapor deposition. The material of the top dielectric layer 225 is, for example, silicon oxide, and the formation method thereof is, for example, chemical vapor deposition. Certainly, the material of the bottom dielectric layer 221 and the top dielectric layer 225 may also be other similar dielectric materials. The material of the charge trapping layer 223 is not limited to silicon nitride, which may also be other materials that can trap charges, such as high k material, tantalum oxide, $SrTiO_3$, and hafnium oxide etc.

Since the composite dielectric layer 220 entirely covers the surfaces of the conductive layer 210 and the substrate 200, thus the composite dielectric layer 220 in other regions on the substrate 200 wherein no memory device is formed (such as the peripheral circuit regions) needs to be removed. Thus, the composite dielectric layer 220 on the sidewalls at the end of the conductive layers 210 is removed all together, as shown in FIG. 4B.

After that, a conductive material layer 227 is formed on the composite dielectric layer 220. The material and formation method of the conductive material layer 227 are as the same as those of the conductive material layer described above, so will not be described again.

Next, referring to FIGS. 3C and 4C, the conductive material layer 227 is patterned so as to form a plurality of gates 230 across the conductive layers 210. The method for patterning the conductive material layer 227 is, for example, first forming a layer of photoresist on the conductive material layer so as to form a patterned photoresist layer (not shown). The patterned photoresist layer is, for example, stripes arranged in parallel and across the conductive layers 210. Next, the conductive material layer 227 exposed by the patterned photoresist layer and the patterned photoresist layer are removed to form the gates 230. The gates 230 are arranged in parallel and across the conductive layers 210, and the gates 230 are the word lines of the memory device.

Wherein, the method for removing part of the conductive material layer 227 is, for example, reactive-ion etching. Moreover, the conductive material can also be removed with the composite dielectric layer 220 as the etching stop layer while removing the exposed conductive material layer 227, so as to make the etching process easier to control.

Next, referring to FIG. 4C again, spacers 235 are formed on the sidewalls at the end of the conductive layers 210, which are, for example, formed together with the spacer of the CMOS process performed by the peripheral circuit region (not shown). After that, a lightly doped region 245' and a heavily doped region 245" are formed under the conductive layers 210 at the same time of forming the lightly doped region and the heavily doped region of the CMOS. The lightly doped region 245' and the heavily doped region 245" are, for example, n-type arsenic-doped regions, and the lightly doped region 245' and the heavily doped region 245" form the doped region 245.

Referring to the top view in FIG. 2B, it is remarkable that the doped regions 245 under two adjacent conductive layers 210 are respectively disposed at one side of one of the two conductive layers 210 and at another side of the other conductive layer 210. In other words, to arrange the conductive layers 210 more closely, the doped regions 245 are, for example, arranged at two sides of the conductive layers 210 in a staggered way.

After that, referring to FIGS. 3C and 4C again, an interlayer dielectric layer 240 is formed on the substrate 200. Then, contact windows 250 and 255 are formed and are electrically connected to the conductive layers 210 and the heavily doped region 245" of the doped regions 245. The contact windows 250 and 255 are respectively connected to different leads, so as to supply appropriate voltages to the conductive layers 210 and the doped regions 245.

An inversion region 210' is formed in the substrate 200 under the conductive layers 210 corresponding to the voltage supplied to the conductive layers 210, and the inversion region 210' can be used as the source/drain. The voltage supplied to the doped region 245 can be used for controlling the voltage of the inversion region 210' (source/drain).

It is worth to mentioned that in the embodiment described above, the formation of the doped region 245 are integrated with the CMOS process and it is the composition of the lightly doped region 245' and the heavily doped region 245". While in other embodiment of the present invention, the doped region 245 may also be formed by performing dopant/ion implanting in a predetermined region before the insulating layer 205 is formed, as shown in FIG. 2D. The dopant implanted is n-type dopant such as arsenic, and the doped region 245 is an entire heavily-doped region.

Besides the two manufacturing methods described above, the present invention also provides another manufacturing method corresponding to the structure of another memory device in the present invention. Referring to FIG. 2A, the difference of this manufacturing method from the embodiments described above is that there is no insulating layer 205 formed on the substrate 200, instead, the conductive layers 210 are formed on the substrate 200 directly.

According to the manufacturing method in the present embodiment, the material of the conductive layers 210 is, for example, doped polysilicon, and the formation method thereof is as described above. Accordingly, during the subsequent procedure of forming the composite dielectric layer 220, the dopant in the conductive layers 210 drives in the substrate 200 due to the high process temperature, so as to form the dopant diffusion region 215.

The dopant diffusion region 215 is used as, for example, the source/drain, the conductive layers 210 are used as, for example, the bit lines. The formation methods of other components are all as the same as those in the embodiments described above, so will not be explained again.

In particular, according to the present manufacturing method, since the dopant diffusion region 215 has been formed in the substrate 200, thus, it is not necessary to form the doped region 245 at the end of the conductive layers 210 additionally. The voltage of the source/drain (the dopant diffusion region 215) can be controlled through the voltage supplied to the conductive layers 210.

In the foregoing manufacturing method of a memory device, since the conductive layers 210 under the gates 230 are used as the local bit lines, thus, while defining the gates 230, it's not necessary to etch the conductive layers 210 at the bottom into blocks, instead, the conductive layers 210 and the gates 230 are separated by the composite dielectric layer 220 with charge storage function, so that problems such as bridging and short circuit between the gates 230 can be avoided.

In addition, since the conductive layers 210 and the gates 230 can be separated by the composite dielectric layer 220, thus, it is not necessary to form a silicon oxide layer additionally in the present manufacturing method, so that the step of chemical mechanical polishing or lift-off can be skipped, accordingly the manufacturing procedure is shortened and meanwhile, the manufacturing cost is reduced.

Moreover, according to the present manufacturing method, a dopant diffusion region 215 is formed in the substrate 200 with the dopant in the conductive layers 210, or even the doped region is not formed in the substrate 200 of the memory device, instead, the inversion region 210' is used as the source/drain, thus, the short channel effect can be reduced effectively, so as to form a memory device with higher integration.

The operating method of the memory device described above will be described below.

Figure 5:
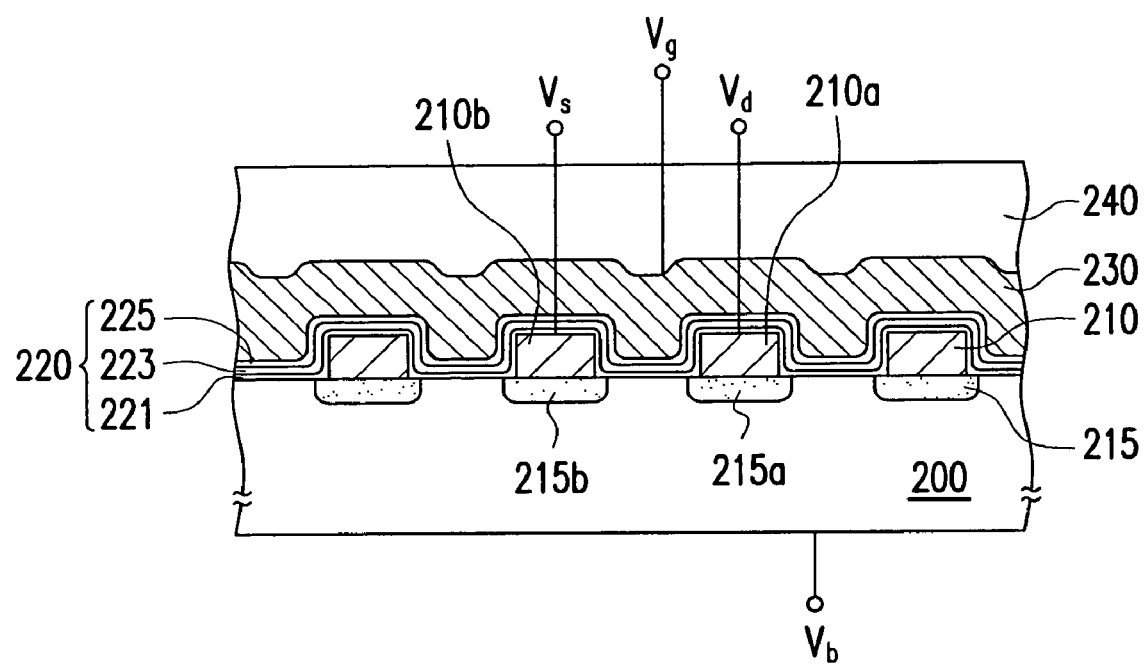
FIG. 5 is diagram illustrating the operation of a memory device according to an embodiment of the present invention.

First, the operating method of the memory device with no insulating layer 205 nor doped region 245 disposed will be described. Referring to FIG. 5, the dopant diffusion region 215 is the source/drain, the conductive layers 210 are the bit lines. While performing programming, the selected dopant diffusion region 215a is used as the drain, and a drain voltage Vd is supplied to the conductive layer 210a (bit line) over the dopant diffusion region 215a; the adjacent dopant diffusion region 215b is used as the source, and a source voltage Vs is supplied to the conductive layer 210b (bit line) over the dopant diffusion region 215b; a control voltage Vg is supplied to the selected gate 230 (word line) across the foregoing source and drain; a substrate voltage Vb is supplied to the substrate 200. Wherein, the voltages arranged from the lowest to the highest are: the substrate voltage, the source voltage, the drain voltage, and the control voltage. Accordingly, the electrons enter the charge trapping layer 223 close to the dopant diffusion region 215a (drain) from the dopant diffusion region 215b (source) through channel hot electron injection mode (CHEI). In an embodiment, the source voltage is, for example, 0V~1V, the drain voltage is, for example, 3V~6V, the control voltage is, for example, 6V~12V, and the substrate voltage is, for example, 0V.

While performing erasing operation, a drain voltage Vd is supplied to the conductive layer 210a over the dopant diffusion region 215a; a source voltage Vs is supplied to the conductive layer 210b over the dopant diffusion region 215b; a control voltage Vg is supplied to the gate 230; a substrate voltage Vb is supplied to the substrate 200. Wherein, the voltages arranged from the lowest to the highest are: the control voltage, the substrate voltage, the source voltage, and the drain voltage. The electrons in the charge trapping layer 223 are erased through band-to-band tunneling induced hot hole injection. In an embodiment, the source voltage is, for example, 0V~1V, or floating, the drain voltage is, for example, 3V~6V, and the control voltage is, for example, 0V~−7V, and the substrate voltage is, for example, 0V.

While performing reading operation, a drain voltage Vd is supplied to the conductive layer 210a over the dopant diffusion region 215a; a source voltage Vs is supplied to the conductive layer 210b over the dopant diffusion region 215b; a control voltage Vg is supplied to the gate 230; a substrate voltage Vb is supplied to the substrate 200. Wherein, the voltages arranged from the lowest to the highest are: the substrate, the source voltage, the drain voltage, and the control voltage. Whether the digital information stored in the charge trapping layer 223 is '1' or '1' is determined based on the channel switch/channel current quantity. In an embodiment, the source voltage is, for example, 0V~0.5V, the drain voltage is, for example, 0.5V~2V, and the control voltage is, for example, 2V~6V, and the substrate voltage is, for example, 0V.

The operating method mentioned above is for the n-type memory device. Since the memory device is also can be a p-type memory device, the following is the operating method thereof.

Referring to FIG. 5, the dopant diffusion region 215 is the source/drain, the conductive layers 210 are the bit lines. While performing programming, the selected dopant diffusion region 215a is used as the drain, and a drain voltage Vd is supplied to the conductive layer 210a (bit line) over the dopant diffusion region 215a; the adjacent dopant diffusion region 215b is used as the source, and a source voltage Vs is supplied to the conductive layer 210b (bit line) over the dopant diffusion region 215b; a control voltage Vg is supplied to the selected gate 230 (word line) across the foregoing source and drain; a substrate voltage Vb is supplied to the substrate 200.

Wherein, the voltages arranged from the lowest to the highest are: the drain voltage, the source voltage, the substrate voltage, and the control voltage. Accordingly, the electrons enter the charge trapping layer 223 close to the dopant diffusion region 215a (drain) from the dopant diffusion region 215b (source) through band-to-band tunneling hot holes induced hot electron injection (BTBTHE). In an embodiment, the source voltage is, for example, 0V~−1V, the drain voltage is, for example, −3V~−6V, the control voltage is, for example, 0V~7V, and the substrate voltage is, for example, 0V.

While performing erasing operation, a drain voltage Vd is supplied to the conductive layer 210a over the dopant diffusion region 215a; a source voltage Vs is supplied to the conductive layer 210b over the dopant diffusion region 215b; a control voltage Vg is supplied to the gate 230; a substrate voltage Vb is supplied to the substrate 200.

Wherein the substrate voltage is higher than the control voltage. The electrons in the charge trapping layer 223 are erased through channel FN tunneling. In an embodiment, the source voltage is, for example, 0V~5V, the drain voltage is, for example, 0~5V, the control voltage is, for example, 0V~−12V and the substrate voltage is, for example, 0~5V.

While performing reading operation, a drain voltage Vd is supplied to the conductive layer 210a over the dopant diffusion region 215a; a source voltage Vs is supplied to the conductive layer 210b over the dopant diffusion region 215b; a control voltage Vg is supplied to the gate 230; a substrate voltage Vb is supplied to the substrate 200. Wherein, the voltages arranged from the lowest to the highest are: the control voltage, the drain voltage, the source voltage and the substrate voltage. Whether the digital information stored in the charge trapping layer 223 is '1' or '0' is determined based on the channel switch/channel current quantity. In an embodiment, the source voltage is, for example, 0V~-0.5V, the drain voltage is, for example, -0.5V~-2V, the control voltage is, for example, -2V~-6V, and the substrate voltage is, for example, 0V.

Figure 6:
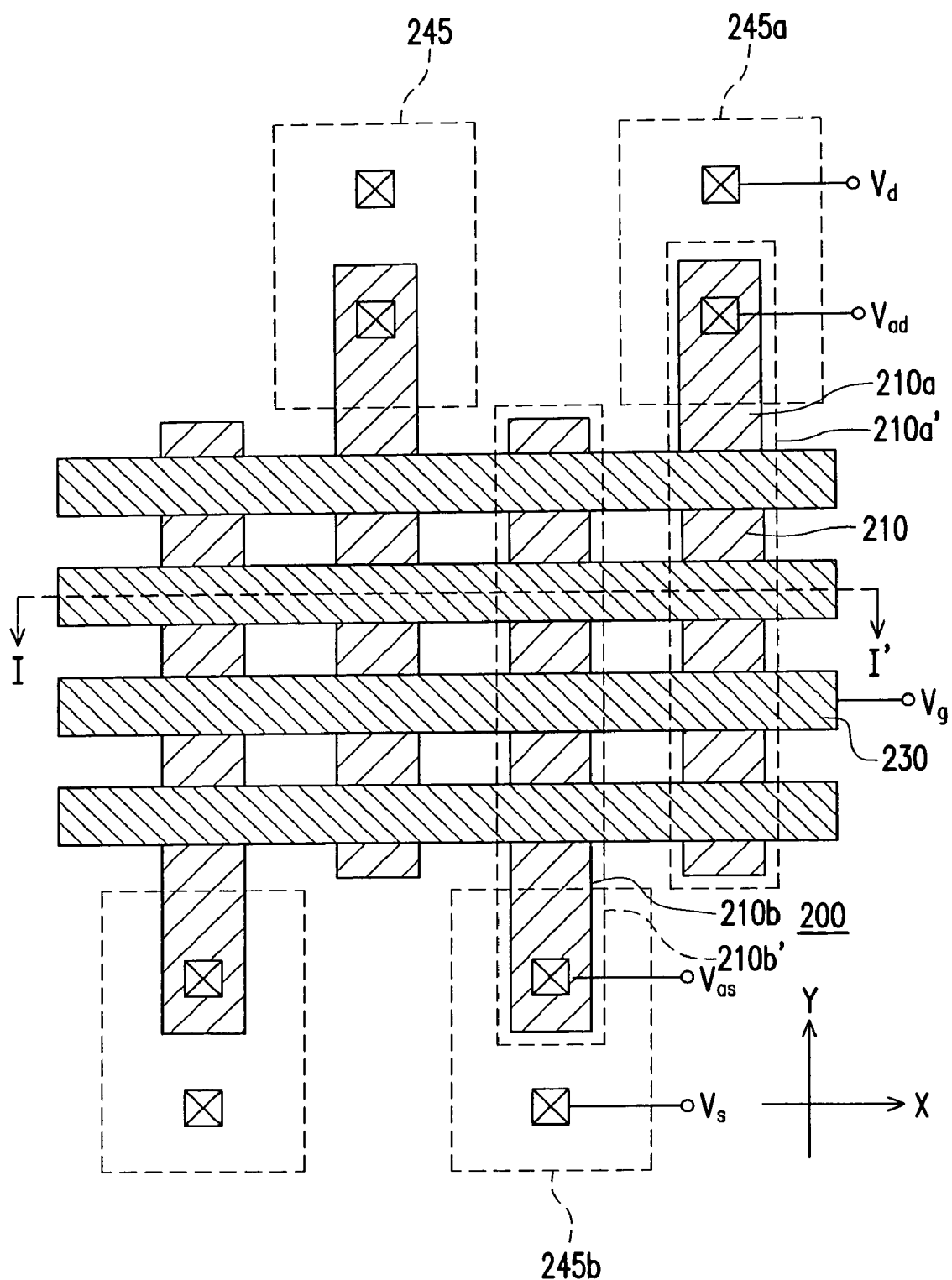
FIG. 6 is diagram illustrating the operation of a memory device according to other embodiment of the present invention.

Next, the operating method of the memory device disposed with an insulating layer 205 and a doped region 245 will be described. Please referr to FIGS. 6 and 2C (the cross-sectional view of the cut along line I-I' of FIG. 6). While performing programming operation, an appropriate auxiliary voltage Vad is supplied to the selected conductive layer 210a, so as to form an drain inversion region 210a' in the substrate 200 under the conductive layers 210a; an appropriate auxiliary voltage Vas is supplied to the conductive layer 210b adjacent to the conductive layer 210a, so as to form a source inversion region 210b' in the substrate 200 under the conductive layer 210b; a drain voltage Vd is supplied to the doped region 245a at the end of the conductive layer 210a; a source voltage Vs is supplied to the doped region 245b at the end of the conductive layer 210b; a control voltage Vg is supplied to the selected gate 230 (word line) across the foregoing source inversion region 210b' and drain inversion region 210a'; a substrate voltage Vb is supplied to the substrate 200.

Wherein, the control voltage is greater than the drain voltage, the drain voltage is greater than the source voltage, the source voltage is greater than the substrate voltage, so that the electrons enter the charge trapping layer 223 close to the drain inversion region 210a' from the source inversion region 210b' through channel hot electron injection (CHEI). In an embodiment, the auxiliary voltages Vad and Vas are, for example, 2V~6V, the source voltage is, for example, 0V~1V, the drain voltage is, for example, 3V~6V, the control voltage is, for example, 6V~12V, and the substrate voltage is, for example, 0V.

Similarly, while performing erasing operation, the appropriate auxiliary voltages Vad and Vas are supplied to the conductive layer 210a and the conductive layer 210b, so as to form the drain inversion region 210a' and the source inversion region 210b' in the substrate 200; a drain voltage Vd is supplied to the doped region 245a; a source voltage Vs is supplied to the doped region 245b; and a control voltage Vg is supplied to the gate 230; a substrate voltage Vb is supplied to the substrate 200, and Vb is, for example, 0V.

Wherein, the drain voltage is greater than the source voltage, the source voltage is greater than the control voltage, so that the electrons in the charge trapping layer 223 are erased through band-to-band tunneling induced hot hole injection. In an embodiment, the auxiliary voltage is, for example, 2V~6V, the source voltage is, for example, 0V~1V or floating, the drain voltage is, for example, 3V~6V, and the control voltage is, for example, 0V~-7V.

Similarly, while performing reading operation, the appropriate auxiliary voltages Vad and Vas are supplied to the conductive layer 210a and the conductive layer 210b, so as to form the drain inversion region 210a' and the source inversion region 210b' in the substrate 200 under the conductive layer 210a and the conductive layer 210b; a drain voltage Vd is supplied to the doped region 245a; a source voltage Vs is supplied to the doped region 245b; a control voltage Vg is supplied to the gate 230 (word line); a substrate voltage Vb is supplied to the substrate 200.

Wherein, the control voltage is, for example, equal to the auxiliary voltage and greater than the drain voltage, the drain voltage is greater than the source voltage, the source voltage is greater than the substrate voltage, and the digital information stored in the charge trapping layer 223 is determined based on the channel switch/channel current quantity. In an embodiment, the auxiliary voltage and the control voltage are, for example, between 2V and 6V, the drain voltage is, for example, between 0.5V and 2V, the source voltage is, for example, between 0V and 0.5V, and the substrate voltage is, for example, 0V.

The embodiment mentioned above is related to an n-type memory device. Following is the operation conditions for a p-type memory device with an insulating layer 205 and a doped region 245. Please refer to FIGS. 6 and 2C (the cross-sectional view of the cut along line I-I' of FIG. 6). While performing programming operation, an appropriate auxiliary voltage Vad is supplied to the selected conductive layer 210a, so as to form an drain inversion region 210a' in the substrate 200 under the conductive layers 210a; an appropriate auxiliary voltage Vas is supplied to the conductive layer 210b adjacent to the conductive layer 210a, so as to form a source inversion region 210b' in the substrate 200 tinder the conductive layer 210b; a drain voltage Vd is supplied to the doped region 245a at the end of the conductive layer 210a; a source voltage Vs is supplied to the doped region 245b at the end of the conductive layer 210b; a control voltage Vg is supplied to the selected gate 230 (word line) across the foregoing source inversion region 210b' and drain inversion region 210a'; a substrate voltage Vb is supplied to the substrate 200.

Wherein, the control voltage is greater than the substrate voltage, the substrate voltage is greater than the source voltage, the source voltage is greater than the drain voltage, so that the electrons enter the charge trapping layer 223 close to the drain region 210a' through band-to-band tunneling hot holes induced hot electron injection (BTBTHE) mechanism. In an embodiment, the auxiliary voltages Vad and Vas are, for example, -2V~-6V, the source voltage is, for example, 0V~-1V, the drain voltage is, for example, -3V~-6V, the control voltage is, for example, 0V~7V, and the substrate voltage is, for example, 0V.

Similarly, while performing erasing operation, the appropriate auxiliary voltages Vad and Vas are supplied to the conductive layer 210a and the conductive layer 210b, so as to form the drain inversion region 210a' and the source inversion region 210b' in the substrate 200; a drain voltage Vd is supplied to the doped region 245a; a source voltage Vs is supplied to the doped region 245b; and a control voltage Vg is supplied to the gate 230.; a substrate voltage Vb is supplied to the substrate 200.

Wherein the substrate voltage is greater than the control voltage, so that the electrons in the charge trapping layer 223 are erased through channel FN tunneling induced hot hole injection. In an embodiment, the auxiliary voltage is, for example, -2V~-6V, the source voltage is, for example, 0V~5V, the drain voltage is, for example, 0V~5V, the substrate voltage is, for example, 0~5V, the control voltage is, for example, 0V~-12V, and the substrate voltage is, for example, 0V~5V.

Similarly, while performing reading operation, the appropriate auxiliary voltages Vad and Vas are supplied to the conductive layer 210a and the conductive layer 210b, so as to form the drain inversion region 210a' and the source inversion region 210b' in the substrate 200 under the conductive layer 210a and the conductive layer 210b; a drain voltage Vd is supplied to the doped region 245a; a source voltage Vs is supplied to the doped region 245b; a control voltage Vg is supplied to the gate 230 (word line); a substrate voltage Vb is supplied to the substrate 200.

Wherein, the control voltage is, for example, equal to the auxiliary voltage and less than the drain voltage, the drain voltage is less than the source voltage, the source voltage is less than the substrate region, and the digital information stored in the charge trapping layer 223 is determined based on the channel switch/channel current quantity. In an embodiment, the auxiliary voltage and the control voltage are, for example, between −2V and −6V, the drain voltage is, for example, between −0.5V and −2V, the source voltage is, for example, between 0V and −0.5V, and the substrate voltage is, for example, 0V.

According to the operating method of a memory device described above, the dopant diffusion regions 215a and 245b are supplied with appropriate voltages and are respectively used as the drain and the source, or by supplying appropriate auxiliary voltages, the drain inversion region 210a' and the source inversion region 210b' are formed under the conductive layers 210, so as to trap the charges in the charge trapping layer 223. Because the junction of the memory device is very shallow, so that the short channel effect can be reduced, and because the resistances values of the conductive layers 210 (bit lines) are very low, the operation speed of the memory device can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
    a substrate;
    a plurality of conductive layers disposed on the substrate, wherein the bottom of each conductive layer is not lower than the entire surface of the substrate;
    a composite dielectric layer disposed on the substrate and covering the conductive layers, the composite dielectric layer comprising a charge trapping layer that covers the conductive layers;
    a plurality of gates, disposed on the composite dielectric layer and across the conductive layers, and used as word lines, wherein a bottom of each gate is higher than the entire surface of the substrate;
    an insulating layer disposed between each conductive layer and the substrate; and
    a plurality of doped regions disposed in the substrate under ends of the conductive layers, wherein the two doped regions under the ends of two neighboring conductive layers are respectively disposed at one end of one of the two conductive layers and at an opposite end of the other of the two conductive layers, and each doped region includes a lightly doped region partially under a corresponding conductive layer, and a heavily doped region connected with the lightly doped region.

2. The memory device as claimed in claim 1, wherein the conductive layers are used as local bit lines.

3. The memory device as claimed in claim 1, wherein the material of the conductive layers is doped polysilicon.

4. The memory device as claimed in claim 1, wherein the material of the charge trapping layer includes silicon nitride.

5. The memory device as claimed in claim 1, wherein the composite dielectric layer comprises a bottom dielectric layer, the charge trapping layer, and a top dielectric layer from bottom to top.

* * * * *